United States Patent
Ishino et al.

(10) Patent No.: US 11,488,895 B2
(45) Date of Patent: Nov. 1, 2022

(54) SEMICONDUCTOR DEVICE AND MAUNFACTURING METHOD OF SEMICONDUCTOR DEVICE

(71) Applicant: DENSO CORPORATION, Kariya (JP)

(72) Inventors: Hiroshi Ishino, Kariya (JP); Hirokazu Sampei, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/392,446

(22) Filed: Aug. 3, 2021

(65) Prior Publication Data

US 2022/0068772 A1 Mar. 3, 2022

(30) Foreign Application Priority Data

Aug. 25, 2020 (JP) .............................. JP2020-141512

(51) Int. Cl.
*H01L 23/495* (2006.01)
*H01L 23/00* (2006.01)

(52) U.S. Cl.
CPC .. *H01L 23/49537* (2013.01); *H01L 23/49534* (2013.01); *H01L 23/49586* (2013.01); *H01L 23/562* (2013.01)

(58) Field of Classification Search
CPC ......... H01L 23/49537; H01L 23/49534; H01L 23/49586; H01L 23/562
See application file for complete search history.

(56) References Cited

U.S. PATENT DOCUMENTS

| 2012/0112332 | A1* | 5/2012 | Minamio ............ H01L 23/4334 438/122 |
| 2013/0307156 | A1 | 11/2013 | Bayerer |
| 2016/0294379 | A1* | 10/2016 | Hayashiguchi ..... H01L 23/3735 |
| 2017/0148770 | A1* | 5/2017 | Ishino .................. H01L 23/3121 |
| 2017/0155341 | A1* | 6/2017 | Nomura .................. H01L 25/18 |
| 2019/0229042 | A1* | 7/2019 | Kimura ............ H01L 23/49575 |
| 2020/0161228 | A1* | 5/2020 | Kimura ............... H01L 23/3142 |

(Continued)

FOREIGN PATENT DOCUMENTS

JP 2017-205948 A 11/2017
WO 2015/025582 A1 2/2015

*Primary Examiner* — Eugene Lee
(74) *Attorney, Agent, or Firm* — Posz Law Group, PLC

(57) ABSTRACT

In a semiconductor device, a first lead frame and a second lead frame are fixed to a metal conductor base by an organic insulating film made of a polyimide-based material. The organic insulating film satisfies relationships of $t_{press1} > t_{cast1}$ and $t_{press2} > t_{cast1}$, where $t_{press1}$ is a thickness of a portion of the organic insulating film sandwiched between the metal conductor base and the first lead frame, $t_{press2}$ is a thickness of a portion of the organic insulating film sandwiched between the metal conductor base and the second lead frame, and $t_{cast1}$ is a thickness of a portion of the organic insulating film that is not sandwiched between the metal conductor base and the first lead frame and is not sandwiched between the metal conductor base and the second lead frame.

11 Claims, 19 Drawing Sheets

(56) References Cited

U.S. PATENT DOCUMENTS

2020/0411419 A1\* 12/2020 Hatori ............... H01L 23/49541
2021/0320013 A1\* 10/2021 Liu ......................... H01L 21/56
2021/0407954 A1\* 12/2021 Yoshihara ............. H01L 23/373

\* cited by examiner

FIG. 13

| T(°C) | $P_{VP}$(kPa) |
|---|---|
| 160 | 21.949 |
| 140 | 8.972 |
| 120 | 3.348 |
| 100 | 1.124 |
| 80 | 0.334 |
| 60 | 0.086 |

FIG. 21

| MATERIAL | LINEAR EXPANSION COEFFICIENT (ppm) | YOUNG'S MODULUS (GPa) | POISSON'S RATIO | BASE PLATE THICKNESS (VOLUME RATIO TO MOUNTED SURFACE SIDE) |
|---|---|---|---|---|
| Cu | 16.5 | 123 | 0.35 | 1.0, 0.5, 0.25 (1.63, 4, 16) |
| PI | 50 | 4, 8, 20 | 0.3 | FIXED TO 0.025 |
| SiN | 2.7 | 301 | 0.3 | FIXED TO 0.025 |

_US 11,488,895 B2_

SEMICONDUCTOR DEVICE AND MAUNFACTURING METHOD OF SEMICONDUCTOR DEVICE

CROSS REFERENCE TO RELATED APPLICATION

The present application claims the benefit of priority from Japanese Patent Application No. 2020-141512 filed on Aug. 25, 2020. The entire disclosure of the above application is incorporated herein by reference.

TECHNICAL FIELD

The present disclosure relates to a semiconductor device and a manufacturing method of a semiconductor device.

BACKGROUND

Conventionally, there has been known a power module as a power converter.

SUMMARY

The present disclosure provides a semiconductor device and a manufacturing method of the semiconductor device in which a first lead frame and a second lead frame are fixed to a metal conductor base by an organic insulating film made of a polyimide-based material. The organic insulating film satisfies relationships of $t_{press1} > t_{cast1}$ and $t_{press2} > t_{cast1}$, where $t_{press1}$ is a thickness of a portion of the organic insulating film sandwiched between the metal conductor base and the first lead frame, $t_{press2}$ is a thickness of a portion of the organic insulating film sandwiched between the metal conductor base and the second lead frame, and $t_{cast1}$ is a thickness of a portion of the organic insulating film that is not sandwiched between the metal conductor base and the first lead frame and is not sandwiched between the metal conductor base and the second lead frame.

BRIEF DESCRIPTION OF DRAWINGS

The above and other objects, features and advantages of the present disclosure will become more apparent from the following detailed description made with reference to the accompanying drawings. In the drawings:

FIG. 13 is a diagram for explaining a dry molding process;

FIG. 21 is a diagram for explaining mechanical properties of materials of substrates;

DETAILED DESCRIPTION

Figure 1:
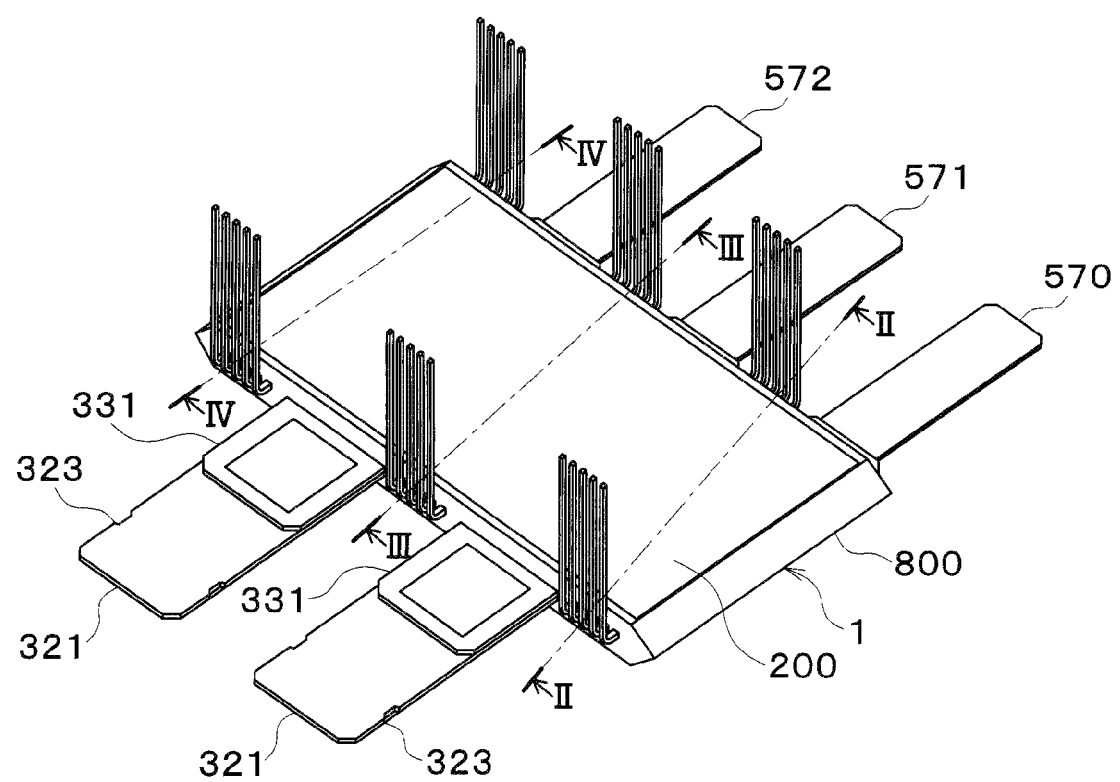
FIG. 1 is a perspective view of a semiconductor device according to a first embodiment.

A power module according to a first comparative example includes two insulating substrates and a semiconductor device disposed between the two insulating substrates. The two insulating substrates have wiring patterns formed on both front and rear surfaces. The wiring patterns formed on the opposing surfaces of the two insulating substrates are electrically connected by metal vias in a space between the two insulating substrates.

A power module according to a second comparative example is equipped with a pair of heat dissipation bases. Between the pair of heat dissipation bases, two semiconductor devices electrically connected in series are sandwiched between conductor plates. The size of the surface of the heat dissipation base facing the conductor plate is larger than the size of the surface of the conductor plate facing the heat dissipation base. The conductor plates are connected to wirings on which terminals are formed. The conductor plates, the wirings, and the terminals are processed into desired shapes in advance.

The semiconductor device and the conductor plates are primarily sealed with a resin in such a manner that the surfaces of the conductor plates opposite from the semiconductor device are exposed. The pair of heat dissipation bases are secondarily sealed with a resin in such a manner that the surfaces of the heat dissipation bases opposite from the conductor plates are exposed.

In the above configuration, the heat dissipation base and the conductor plate are insulated by an insulating sheet. The insulating sheet is thermocompression bonded to the conductor plate that is primarily sealed. Subsequently, the insulating sheet and the heat dissipation base are thermocompression bonded. After that, the secondary sealing is performed. As a result, the insulating sheet is sandwiched between the heat dissipation base and the conductor plate.

In the second comparative example, the conductor plates, the wiring, and the terminals are processed in advance. On the other hand, in a third comparative example, a metal plate is processed into a desired pattern after thermocompression bonding.

Specifically, two laminated plates in which an adhesive sheet as an insulating sheet is attached to a metal foil are prepared, and the adhesive sheets of the two laminated plates are thermocompression bonded to each other to form a laminated plate having metal foil on both sides. Then, by processing the metal foil, a desired pattern can be formed on the metal foil.

A power module may operate in a state of being mounted on a device that requires power conversion. Therefore, the device requires a space for mounting the power module in a housing of the device. In addition, the power module needs to have such a size that the power module can be mounted in the housing of the power module. Therefore, reduction in size of the power module is desired.

However, in the power module according to the first comparative example, the vias make an electrical connection between the wiring patterns of the two insulating substrates. Therefore, it is necessary to secure not only the area for the semiconductor device but also the connection area for the vias on the front and rear surfaces of the insulating substrates. Therefore, it is difficult to reduce the size of the front and rear surfaces of the insulating substrates in a plane direction.

Further, in order to reduce the size, it is necessary to integrate multiple semiconductor devices into a power module. However, in the first comparative example, since the wiring patterns are formed on the front and rear surfaces of each insulating substrate, the wiring patterns become complicated with integration of the multiple semiconductor devices. As a result, each insulating substrate may be warped due to the difference between the linear expansion coefficient of the wiring patterns and the linear expansion coefficient of each insulating substrate. Further, each insulating substrate may be warped due to the difference in the density of the wiring patterns formed on the front and rear surfaces of each insulating substrate. Therefore, it is difficult to integrate multiple semiconductor devices into a power module.

On the other hand, in the power module according to the second comparative example, two semiconductor devices can be integrated. However, the size of the surface of the heat dissipation base facing the conductor plate and the size of the surface of the conductor plate facing the heat dissipation base are different. Since pressure is not applied to a portion of the insulating sheet that is not sandwiched between both the heat dissipation base and the conductor plate during thermocompression bonding, the portion that is not sandwiched may not be bonded. Then, since the portion that is not sandwiched is not pressurized from the conductor plate, the portion may become a starting point for peeling from the insulating sheet with aged deterioration.

Further, since the portion of the insulating sheet that is not sandwiched between both the heat dissipation base and the conductor plate is not restrained by the conductor plate, and the portion may be thicker than a portion sandwiched between both the heat dissipation base and the conductor plate. For this reason, the binding force due to the resin sealing becomes difficult to act on the portion of the insulating sheet that is not sandwiched between the heat dissipation base and the conductor plate, so that the portion that is not sandwiched becomes easy to peel off from the heat dissipation base. Therefore, although the two semiconductor devices can be integrated, it is difficult to ensure the reliability of the power module.

On the other hand, in the laminated substrate according to the third comparative example, the metal foil can be patterned by machining or etching the metal foil. Therefore, the size in the plane direction can be reduced as compared with the case of using a metal part such as a conductor plate patterned in advance. However, when the metal foil is thick, it may take a long time to pattern if the processing is performed only by the etching process. In addition, the corners of the opening of the pattern may be rounded by etching for a long time.

Therefore, it is conceivable to pattern the metal foil by machining. However, since it is difficult to completely remove the metal foil only by machining, etching process needs to be performed after machining. Therefore, it costs a lot to pattern. Therefore, it is difficult to reduce the size without increasing costs.

Since a part of the adhesive sheet is exposed from the metal foil by the patterning of the metal foil, the adhesive sheet may have an un-bonded portion that is not sandwiched between the two metal foils. Therefore, similarly to the above, the portion of the adhesive sheet that is not sandwiched between the two metal foils is easy to peel off from the metal foils.

A semiconductor device according to a first aspect of the present disclosure includes a metal conductor base, a first lead frame, a second lead frame, a third lead frame, and a fourth lead frame. Further, the semiconductor device includes a joint portion, a first power element, a second power element, and a mold resin portion.

The metal conductor base has a first surface and a second surface located on an opposite side from the first surface. The first lead frame is fixed to the first surface of the metal conductor base. The second lead frame is fixed to the first surface of the metal conductor base and is arranged away from the first lead frame. The third lead frame is arranged above the first lead frame in a thickness direction that is perpendicular to the first surface of the metal conductor base. The fourth lead frame is arranged above the second lead frame in the thickness direction.

The joint portion has a first end portion and a second end portion located on an opposite side from the first end portion. The first end portion is integrated with the first lead frame. The second end portion is integrated with the fourth lead frame. The joint portion electrically connects the first lead frame and the fourth lead frame.

The first power element is arranged between the first lead frame and the third lead frame. The first power element is electrically connected to the first lead frame and the third lead frame. The second power element is arranged between the second lead frame and the fourth lead frame. The second power element is electrically connected to the second lead frame and the fourth lead frame.

The mold resin portion integrally seals a part of the metal conductor base, the first lead frame, the second lead frame, the first power element, the second power element, the joint portion, the third lead frame, and the fourth lead in a state where the second surface of the metal conductor base is exposed from the mold resin portion.

Fixing of the first lead frame to the first surface of the metal conductor base and fixing of the second lead frame to the first surface of the metal conductor base is ensured by an organic insulating film made of a polyimide-based material.

The organic insulating film satisfies relationships of $t_{press1} > t_{cast1}$ and $t_{press2} > t_{cast1}$, where $t_{press1}$ is a thickness of a portion of the organic insulating film that is sandwiched between the metal conductor base and the first lead frame, $t_{press2}$ is a thickness of a portion of the organic insulating film that is sandwiched between the metal conductor base and the second lead frame, and $t_{cast1}$ is a thickness of a portion of the organic insulating film that is not sandwiched between the metal conductor base and the first lead frame and is not sandwiched between the metal conductor base and the second lead frame.

In a manufacturing method of a semiconductor device according to a second aspect of the present disclosure, a metal conductor base, a first lead frame, and a second lead frame are prepared. The metal conductor base has a first surface and a second surface located on an opposite side from the first surface.

Subsequently, the first surface of the metal conductor base is coated with a base-side film made of a polyimide-based resin, a mounted surface of the first lead frame that is mounted to the first surface of the metal conductor base is coated with a first film made of the polyimide-based resin, and a mounted surface of the second lead frame that is mounted to the first surface of the metal conductor base is coated with a second film made of the polyimide-based resin.

Subsequently, the base-side film, the first film, and the second film are dried so that the base-side film, the first film, and the second film are semi-cured.

Subsequently, the base-side film and the first film are bonded together, and the base-side film and the second film are bonded together.

Subsequently, the base-side film, the first film, and the second film are cured to form an organic insulating film.

After that, a third lead frame is arranged above the first lead frame in a thickness direction that is perpendicular to the first surface of the metal conductor base, a fourth lead frame is arranged above the second lead frame in the thickness direction, and the first lead frame and the fourth lead frame are electrically connected by a joint portion.

The curing of the base-side film, the first film, and the second film includes forming the organic insulating film so as to satisfy relationships of $t_{press1} > t_{cast1}$ and $t_{press2} > t_{cast1}$, where $t_{press1}$ is a thickness of a portion of the organic insulating film that is sandwiched between the metal conductor base and the first lead frame, $t_{press2}$ is a thickness of a portion of the organic insulating film that is sandwiched between the metal conductor base and the second lead frame, and $t_{cast1}$ is a thickness of a portion of the organic insulating film that is not sandwiched between the metal conductor base and the first lead frame and is not sandwiched between the metal conductor base and the second lead frame.

Accordingly, the first lead frame and the fourth lead frame whose positions are different in an arrangement direction, in which the first lead frame and the second lead frame are arranged, and the thickness direction in a plane direction parallel to the first surface of the metal conductor base are connected by the joint portion. As a result, the first lead frame and the fourth lead frame can be electrically connected at the shortest distance. Therefore, it is possible to reduce a size of the semiconductor device in which multiple power elements are integrated in the arrangement direction.

Further, the first lead frame, the second lead frame, and the metal conductor base are fixed by the organic insulating film made of the polyimide-based material. Therefore, it is not necessary to perform processing such as machining or etching on a metal plate as a source of the first lead frame and the second lead frame. Therefore, the cost of the semiconductor device can be reduced.

Further, the thickness of the portion of the organic insulating film that is not sandwiched by the first lead frame and the second lead frame is thinner than the thicknesses of the portions sandwiched by the first lead frame and the second lead frame. Therefore, the binding force of the mold resin is easy to act on the portion of the organic insulating film that is not sandwiched by the first lead frame and the second lead frame, so that peeling of the portion can be suppressed. Therefore, the reliability of the semiconductor device can be ensured.

Embodiments of the present disclosure will be described below with reference to the drawings. In the following embodiments, identical or equivalent elements are denoted by the same reference numerals as each other in the drawings.

First Embodiment

A first embodiment will be described with reference to the drawings. A semiconductor device according to the present embodiment may be applied to a power converter such as an inverter.

As shown in FIGS. 1 to 8, a semiconductor device 1 includes a first metal conductor base 100, a second metal conductor base 200, first to eighth lead frames 310 to 380, and first to third joint portions 410 to 430. The semiconductor device 1 further includes first to sixth power elements 510 to 560, a first organic insulating film 600, a second organic insulating film 700, and a mold resin portion 800.

Figure 2:
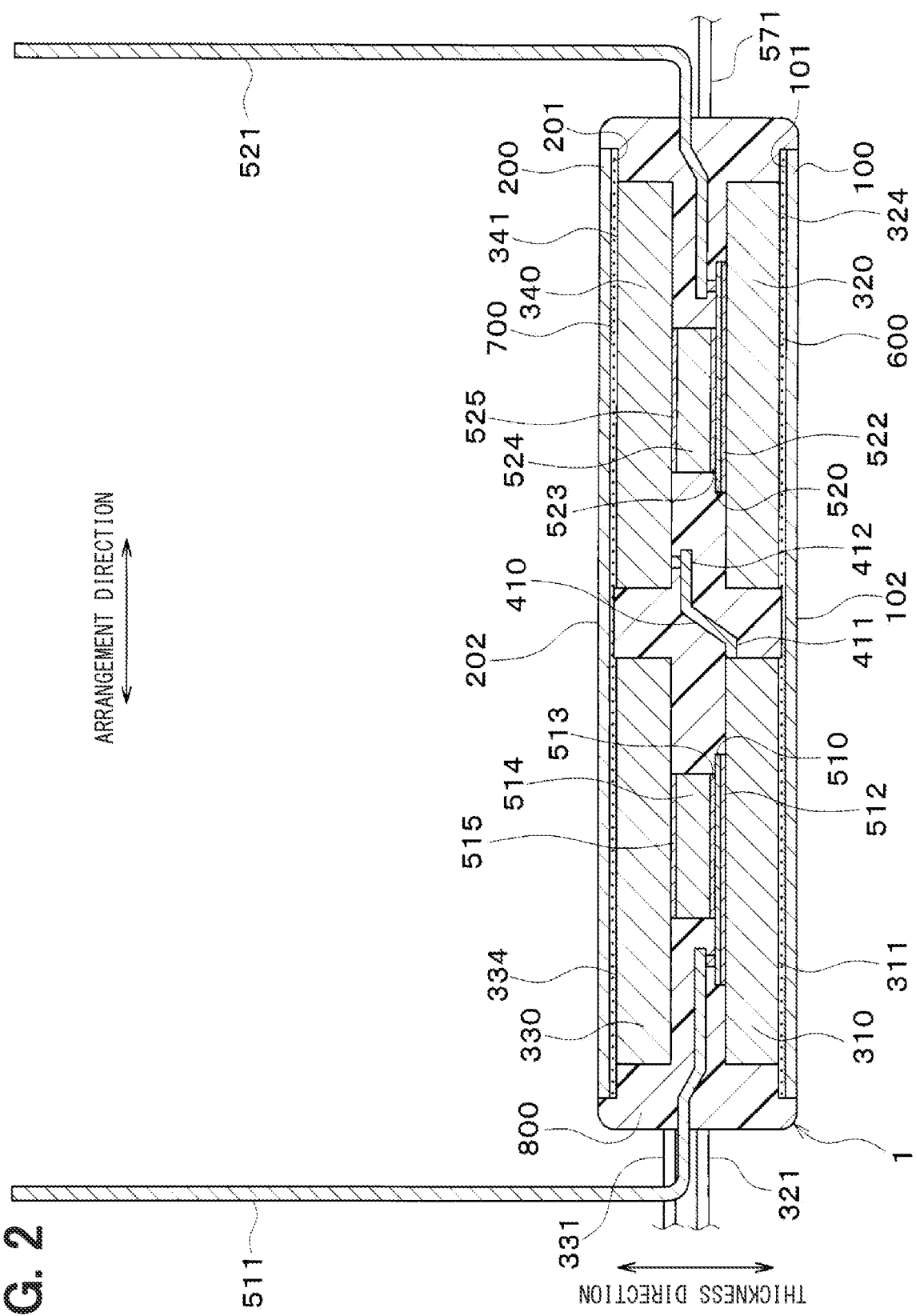
FIG. 2 is a cross-sectional view of the semiconductor device taken along line II-II in FIG. 1.

As shown in FIG. 2, the first metal conductor base 100 has a first surface 101 and a second surface 102 located on an opposite side from the first surface 101. The second metal conductor base 200 has a first surface 201 and a second surface 202 located on an opposite side from the first surface 201. The metal conductor bases 100 and 200 receive heat of the lead frames 310 to 340 and release the heat to the outside. The metal conductor bases 100 and 200 are metal plates made of, for example, Cu.

The lead frames 310 to 340 are heat sinks that receive heat from the power element 510 and 520 and release the heat to the metal conductor bases 100 and 200. Further, the lead frames 310 to 340 are wirings for supplying electric power to the power elements 510 and 520. The lead frames 310 to 340 are metal blocks made of, for example, Cu.

The first lead frame 310 is fixed to the first surface 101 of the first metal conductor base 100 by the first organic insulating film 600 made of a polyimide-based material. The second lead frame 320 is fixed to the first surface 101 of the first metal conductor base 100 by the first organic insulating film 600, and is arranged away from the first lead frame 310.

The first lead frame 310 and the second lead frame 320 are arranged in an arrangement direction which is one of plane directions parallel to the first surface 101 of the first metal conductor base 100.

The third lead frame 330 is arranged above the first lead frame 310 in a thickness direction that is perpendicular to the first surface 101 of the first metal conductor base 100. The third lead frame 330 is paired with the first lead frame 310. The third lead frame 330 is fixed to the first surface 201 of the second metal conductor base 200 by the second organic insulating film 700 made of a polyimide-based material.

The fourth lead frame 340 is arranged above the second lead frame 320 in the thickness direction. The fourth lead frame 340 is paired with the second lead frame 320. The fourth lead frame 340 is fixed to the first surface 201 of the second metal conductor base 200 by the second organic insulating film 700. The fourth lead frame 340 is arranged away from the third lead frame 330.

The first joint portion 410 is a wiring that electrically connects the first lead frame 310 and the fourth lead frame 340. The first joint portion 410 has a first end portion 411 and a second end portion 412 located on an opposite side from the first end portion 411. The first end portion 411 is integrated with the first lead frame 310. The second end portion 412 is integrated with the fourth lead frame 340. The first joint portion 410 crosses the space between the first lead frame 310 and the fourth lead frame 340 in the arrangement direction and the thickness direction. As a result, the first lead frame 310 and the fourth lead frame 340 can be connected at the shortest distance.

The first power element 510 and the second power element 520 are semiconductor chips on which semiconductor elements such as IGBTs and power MOS transistors are formed. The first power element 510 has first signal terminals 511. The first signal terminals 511 are electrically connected to a pad of the semiconductor chip. The second power element 520 has second signal terminals 521. The second signal terminals 521 are electrically connected to a pad of the semiconductor chip. The first signal terminals 511 and the second signal terminals 521 receive control signals from an external device.

The first power element 510 is arranged between the first lead frame 310 and the third lead frame 330. The first power element 510 is electrically and thermally connected to the first lead frame 310 via a solder 512. Above the first power element 510, a heat sink 514 made of, for example, Cu is electrically and thermally connected via a solder 513. The heat sink 514 is electrically and thermally connected to the third lead frame 330 via a solder 515.

The second power element 520 is arranged between the second lead frame 320 and the fourth lead frame 340. The second power element 520 is electrically and thermally connected to the second lead frame 320 via a solder 522. Above the second power element 520, a heat sink 524 made of, for example, Cu is electrically and thermally connected via a solder 523. The heat sink 524 is electrically and thermally connected to the fourth lead frame 340 via a solder 525.

Figure 5:
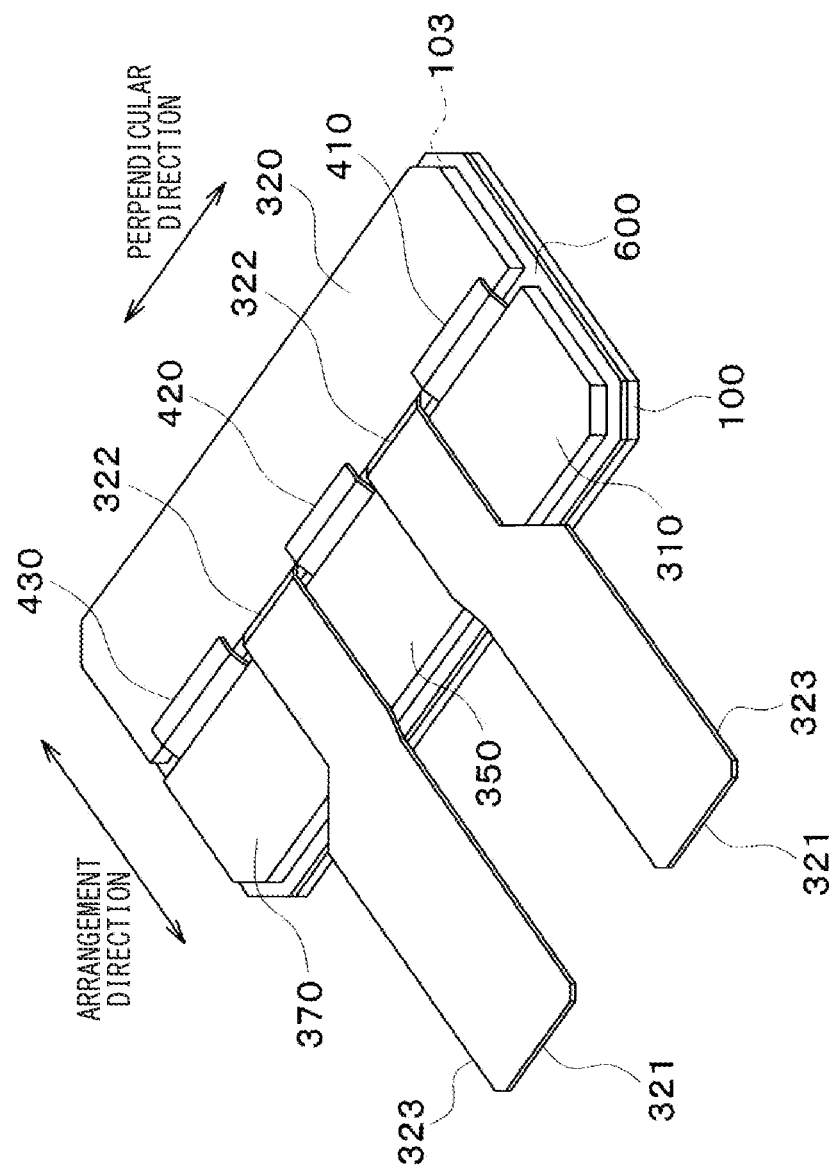
FIG. 5 is a perspective view of a first metal conductor base, a first lead frame, a second lead frame, a fifth lead frame, and a seventh lead frame.

In the present embodiment, the semiconductor device 1 includes three sets of the lead frames 310 to 340, the first joint portion 410, the first power element 510, and the second power element 520 shown in FIG. 2. The three sets are arranged in a direction perpendicular to the arrangement direction on the first surface 101 of the first metal conductor base 100. Further, as shown in FIG. 5, three second lead frames 320 in the three sets are integrally configured as one lead frame. Similarly, three third lead frames 330 in the three sets are integrally configured as one lead frame.

Figure 3:
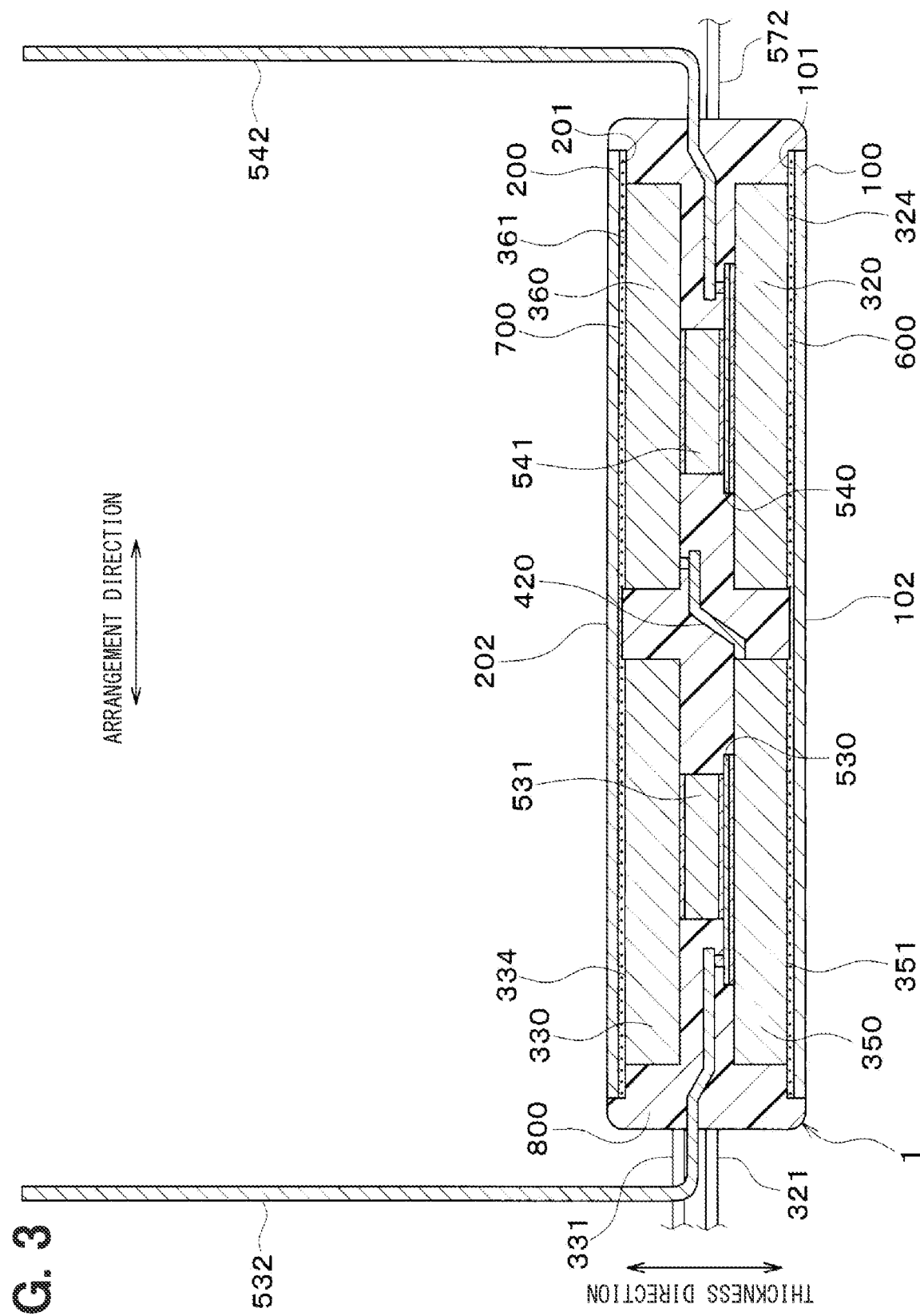
FIG. 3 is a cross-sectional view of the semiconductor device taken along line III-III in FIG. 1.
Figure 4:
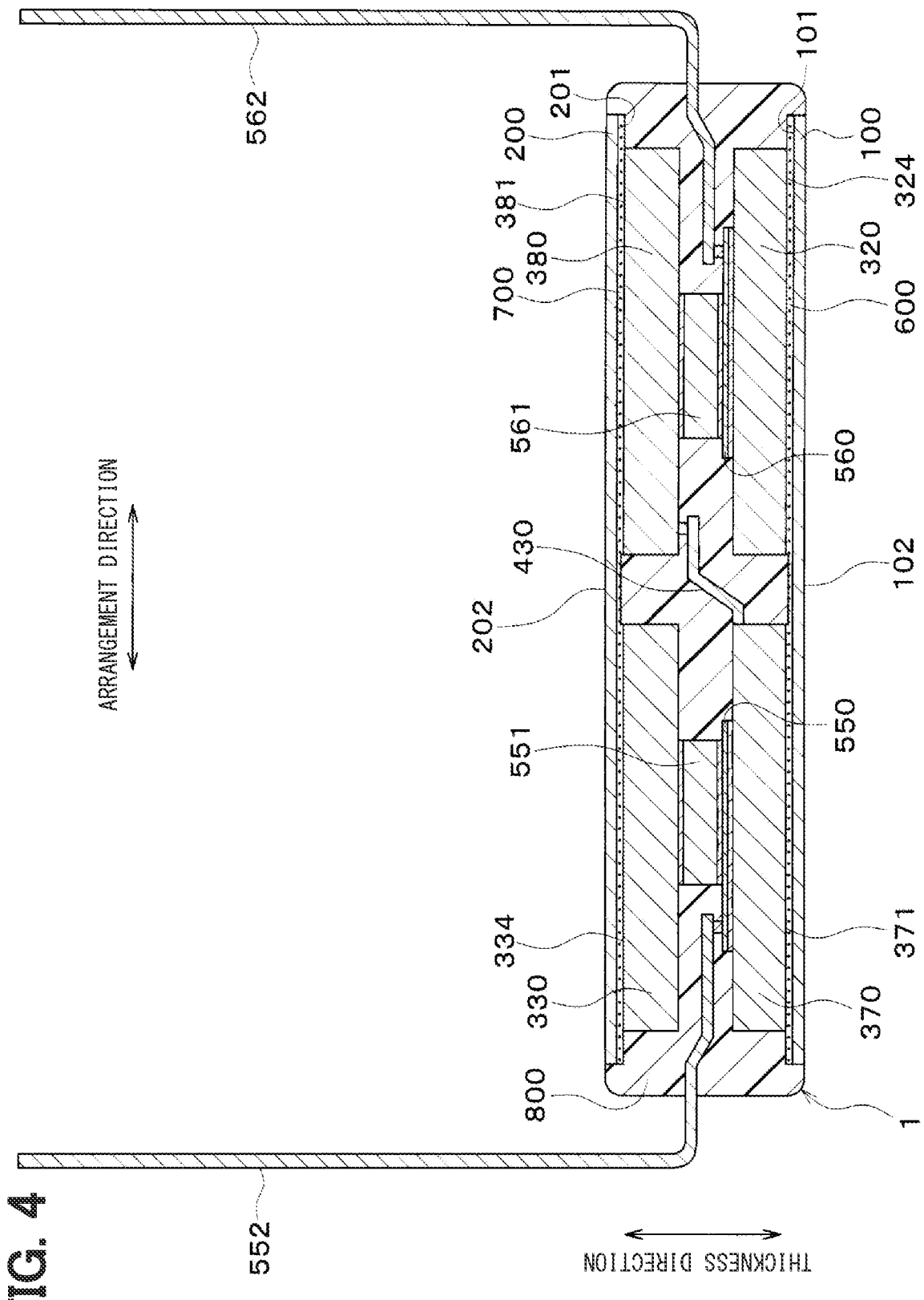
FIG. 4 is a cross-sectional view of the semiconductor device taken along line IV-IV in FIG. 1.

FIG. 3 shows a set of the lead frames 320, 330, 350, 360, the second joint portion 420, the third power element 530, and the fourth power element 540. FIG. 4 shows a set of the lead frames 320, 330, 370, 380, the third joint portion 430, the fifth power element 550, and the sixth power element 560. The fifth lead frame 350 and the seventh lead frame 370 correspond to the first lead frame 310 described above. The sixth lead frame 360 and the eighth lead frame 380 correspond to the fourth lead frame 340 described above. The second joint portion 420 and the third joint portion 430 correspond to the first joint portion 410 described above. The third power element 530 and the fifth power element 550 correspond to the first power element 510 described above. The fourth power element 540 and the sixth power element 560 correspond to the second power element 520 described above.

The third power element 530 is connected to a heat sink 531. The third power element 530 has third signal terminals 532. The fourth power element 540 is connected to a heat sink 541. The fourth power element 540 has fourth signal terminals 542. The fifth power element 550 is connected to a heat sink 551. The fifth power element 550 has fifth signal terminals 552. The sixth power element 560 is connected to a heat sink 561. The sixth power element 560 has sixth signal terminals 562.

That is, in the semiconductor device 1, the six power elements 510 to 560 are packaged into one. According to the above configuration, the first power element 510 and the second power element 520 are connected in series. The third power element 530 and the fourth power element 540 are connected in series. The fifth power element 550 and the sixth power element 560 are connected in series. Each of the power elements 520, 540, and 560 forms, for example, an upper arm, and each of the power elements 510, 530, and 550 forms, for example, a lower arm. Then, each intermediate potential between the upper arm and the lower arm is output to the outside via the first output terminal 570, the second output terminal 571, or the third output terminal 572 shown in FIG. 1.

As shown in FIG. 5, the second lead frame 320 is provided with two first wiring terminals 321. Each of the first wiring terminal 321 has a first connection portion 322 and a first tip portion 323 located on an opposite side from the first connection portion 322.

The first connection portion 322 of one of the first wiring terminals 321 is located above a portion between the first lead frame 310 and the fifth lead frame 350, and is integrated with the second lead frame 320. The first tip portion 323 of one of the first wiring terminal 321 is arranged on an opposite side from the second lead frame 320 with reference to the first lead frame 310 and the fifth lead frame 350 in the arrangement direction.

Figure 6:
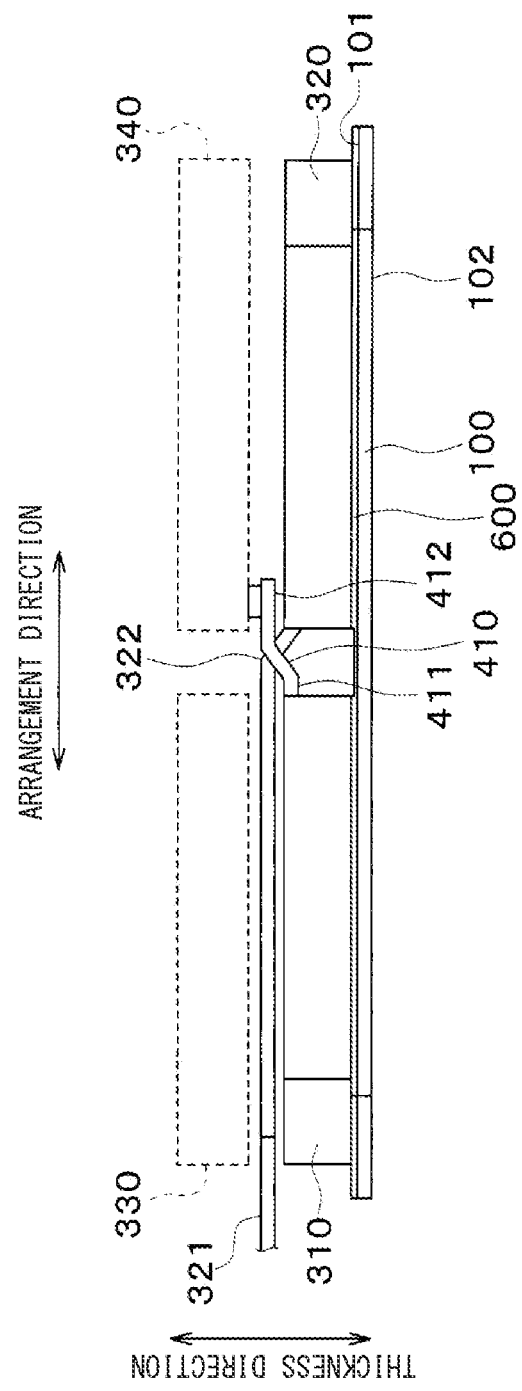
FIG. 6 is a view of a side surface of the first lead frame and a side surface of the second lead frame.

As shown in FIG. 6, the first connection portion 322 of one of the first wiring terminals 321 is bent in the thickness direction. As a result, a part of an intermediate portion between the first connection portion 322 and the first tip portion 323 of one of the first wiring terminal 321 is arranged between the lead frames 310, 330, and 350 without coming into contact with the lead frames 310, 330, 350, and the power elements 510, 530.

The first connection portion 322 of the other first wiring terminal 321 is located above a portion between the fifth lead frame 350 and the seventh lead frame 370, and is integrated with the second lead frame 320. The first tip portion 323 of the other first wiring terminal 321 is arranged on the opposite side from the second lead frame 320 with reference to the fifth lead frame 350 and the seventh lead frame 370 in the arrangement direction.

The first connection portion 322 of the other first wiring terminal 321 is bent in the thickness direction. As a result, a part of an intermediate portion between the first connection portion 322 and the first tip portion 323 of the other first wiring terminal 321 is arranged between the lead frames 330, 350 and 370 without coming into contact with the lead frames 330, 350, 370, and the power elements 530, 550.

Figure 7:
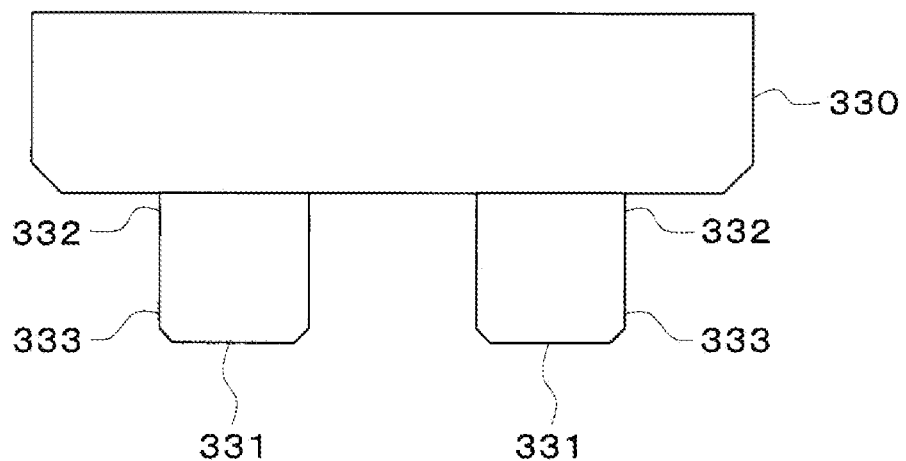
FIG. 7 is a plan view showing a third lead frame, a first wiring terminal, and a second wiring terminal.

As shown in FIG. 7, the third lead frame 330 includes two second wiring terminals 331. Each of the second wiring terminal 331 has a second connection portion 332 and a second tip portion 333 located on an opposite side from the second connection portion 332.

The second connection portion 332 of one of the second wiring terminals 331 is integrated with a corresponding portion of the third lead frame 330 between the fourth lead frame 340 and the sixth lead frame 360. The second tip portion 333 of one of the second wiring terminals 331 is arranged opposite from the fourth lead frame 340 with reference to the third lead frame 330 in the arrangement direction. A part of an intermediate portion between the second connection portion 332 and the second tip portion 333 of one of the second wiring terminals 331 does not come into contact with the first power element 510 and the second power element 520.

The second connection portion 332 of the other second wiring terminal 331 is integrated with a corresponding portion of the third lead frame 330 between the sixth lead frame 360 and the eighth lead frame 380. The second tip portion 333 of the other second wiring terminal 331 is arranged on an opposite side from the fourth lead frame 340 with reference to the third lead frame 330 in the arrangement direction. A part of an intermediate portion between the second connection portion 332 and the second tip portion 333 of the other second wiring terminal 331 does not come into contact with the third power element 530 and the fifth power element 550.

The first wiring terminal 321 and the second wiring terminal 331 are terminals for supplying power to the power elements 510 to 560. One of the first wiring terminals 321 and one of the second wiring terminals 331 are power supply terminals of the power element 510 to 560, and the others are ground terminals.

The mold resin portion 800 integrally seals the parts of the metal conductor bases 100 and 200, the lead frames 310 to 380, the power elements 510 to 560, and the joint portions 410 to 430 with the second surfaces 102 and 202 of the metal conductor bases 100 and 200 exposed. Further, the mold resin portion 800 seals the first wiring terminal 321 and the second wiring terminal 331 in a state where the first tip portions 323 of the first wiring terminals 321 and the second tip portions 333 of the second wiring terminals 331 exposed from the mold resin portion 800. The mold resin portion 800 is made of a thermosetting resin such as an epoxy resin. The term "exposed from" means "not covered with".

The first organic insulating film 600 fixes the first surface 101 of the first metal conductor base 100 and each of the lead frames 310, 320, 350, and 370. The first organic insulating film 600 thermally connects the first surface 101 of the first metal conductor base 100 and each of the lead frames 310, 320, 350, and 370, while electrically insulating the first surface 101 of the first metal conductor base 100 and each of the lead frames 310, 320, 350, and 370.

Figure 8:
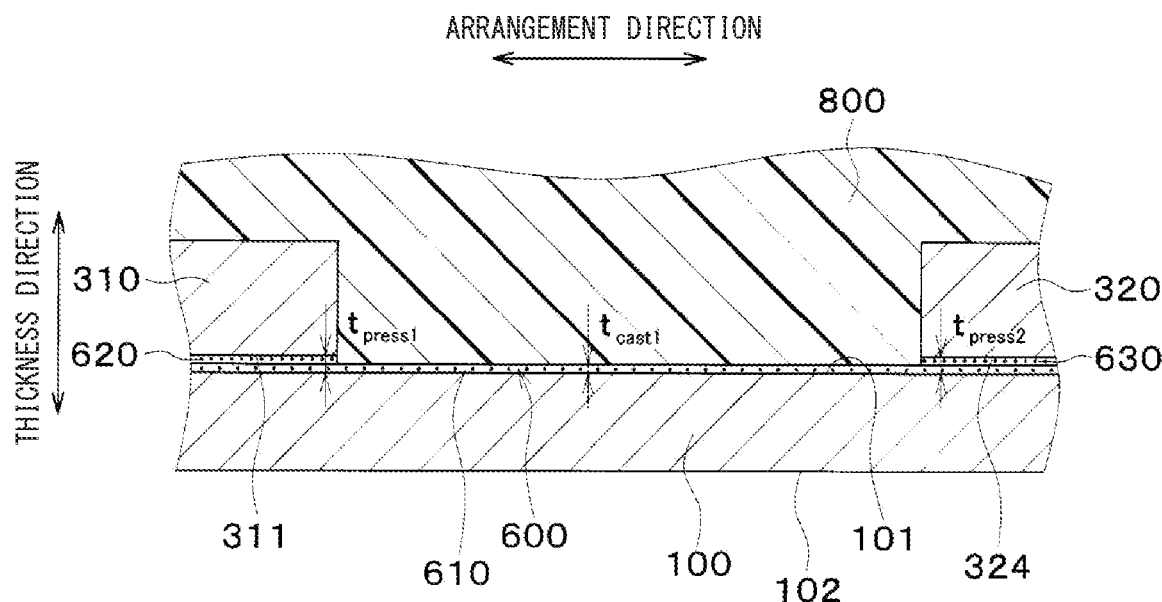
FIG. 8 is an enlarged cross-sectional view showing a first organic insulating film.

As shown in FIG. 8, the first organic insulating film 600 has a first base-side film 610, a first film 620, and a second film 630. The first base-side film 610 is formed on the entire first surface 101 of the first metal conductor base 100. The first film 620 is formed on entire mounted surfaces 311, 351 and 371 of the lead frames 310, 350 and 370 mounted to the first surface 101 of the first metal conductor base 100. The second film 630 is formed on an entire mounted surface 324 of the second lead frame 320 mounted to the first surface 101 of the first metal conductor base 100. A surface layer portion of the first film 620 and a surface layer portion of the second film 630 are chemically bonded with a surface layer portion of the first base-side film 610 by forming a polymer.

The first organic insulating film 600 satisfies relationships of $t_{press1} > t_{cast1}$ and $t_{press2} > t_{cast1}$, where $t_{press1}$ is a thickness of a portion of the first organic insulating film 600 that is sandwiched between the first metal conductor base 100 and the first lead frame 310, $t_{press2}$ is a thickness of the first organic insulating film 600 that is sandwiched between the first metal conductor base 100 and the second lead frame 320, and $t_{cast1}$ is a thickness of a portion of the first organic insulating film 600 that is not sandwiched between the first metal conductor base 100 and the first lead frame 310 and is not sandwiched between the first metal conductor base 100 and the second lead frame 320.

The thickness $t_{press1}$ of the first organic insulating film 600 corresponds to a thickness of a portion of the first organic insulating film 600 that is sandwiched between the first metal conductor base 100 and the fifth lead frame 350, and a thickness of a portion of the first organic insulating film 600 that is sandwiched between first metal conductor base 100 and the seventh lead frame 370. Therefore, the above relationship is also satisfied for the fifth lead frame 350 and the seventh lead frame 370.

The second organic insulating film 700 fixes the first surface 201 of the second metal conductor base 200 and each of the lead frames 330, 340, 360, and 380. The second organic insulating film 700 thermally connects the first surface 201 of the second metal conductor base 200 and each of the lead frames 330, 340, 360, and 380, while electrically insulating the first surface 201 of the second metal conductor base 200 and each of the lead frames 330, 340, 360, and 380.

Figure 9:
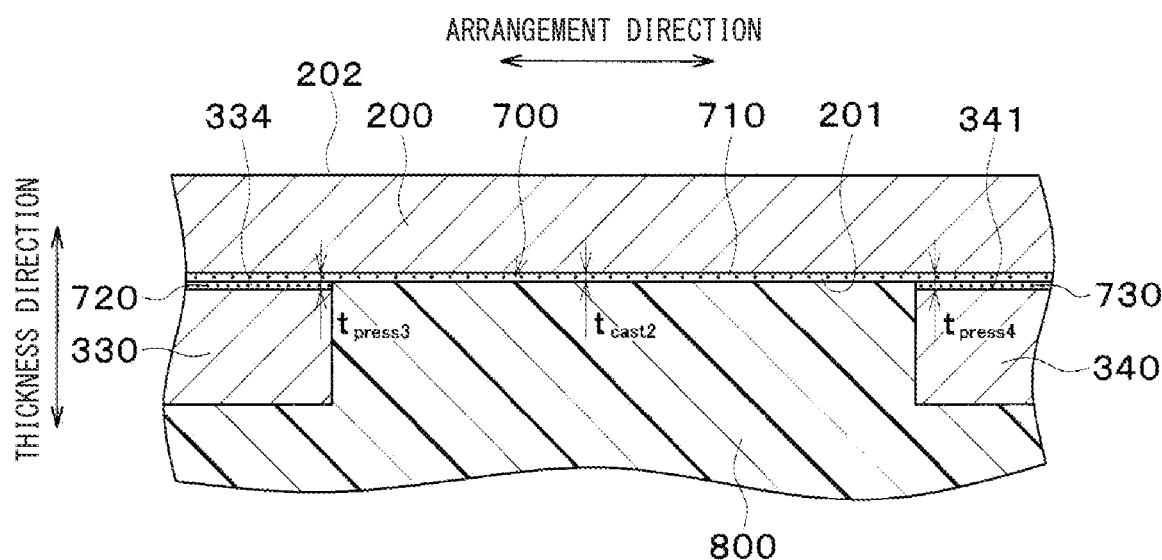
FIG. 9 is an enlarged cross-sectional view showing a second organic insulating film.

As shown in FIG. 9, the second organic insulating film 700 has a second base side film 710, a third film 720, and a fourth film 730. The second base side film 710 is formed on the entire first surface 201 of the second metal conductor base 200. The third film 720 is formed on an entire mounted surface 334 of the third lead frame 330 mounted to the first surface 201 of the second metal conductor base 200. The fourth film 730 is formed on entire mounted surfaces 341, 361, and 381 of the lead frames 340, 360, and 380 mounted to the first surface 201 of the second metal conductor base 200. A surface layer portion of the third film 720 and a surface layer portion of the fourth film 730 are chemically bonded by forming a polymer with a surface layer portion of the second base-side film 710.

The second organic insulating film 700 satisfies relationships of $t_{press3} > t_{cast2}$ and $t_{press4} > t_{cast2}$, where $t_{press3}$ is a thickness of a portion of the second organic insulating film 700 that is sandwiched between the second metal conductor base 200 and the third lead frame 330, $t_{press4}$ is a thickness of a portion of the second organic insulating film 700 that is sandwiched between the second metal conductor base 200 and the fourth lead frame 340, and $t_{cast2}$ is a thickness of a portion of the second organic insulating film 700 that is not sandwiched between the second metal conductor base 200 and the third lead frame 330 and is not sandwiched between the second metal conductor base 200 and the fourth lead frame 340.

The thickness $t_{press4}$ also corresponds to a thickness a portion of the second organic insulating film 700 that is sandwiched between the second metal conductor base 200 and the sixth lead frame 360, and a thickness of a portion of the second organic insulating film 700 that is sandwiched between the second metal conductor base 200 and the eighth lead frame 380. Therefore, the above relationship is also satisfied for the sixth lead frame 360 and the eighth lead frame 380.

In the organic insulating films 600 and 700, the portions of the thicknesses $t_{cast1}$ and $t_{cast2}$ are the portions that come into contact with the mold resin portion 800, so that the binding force of the mold resin portion 800 acting on the portions increase with decrease in the thicknesses of the portions. Further, since the portions of the thicknesses $t_{press1}$, $t_{press2}$, $t_{press3}$, and $t_{press4}$ in the organic insulating films 600 and 700 are insulation guarantee portions, the binding force of the mold resin portion 800 acting on the portions increase with decrease in the thicknesses of the portions. Therefore, peeling of the organic insulating films 600 and 700 from the metal conductor bases 100 and 200 is less likely to occur.

The thicknesses $t_{press1}$, $t_{press2}$, $t_{press3}$, and $t_{press4}$ are, for example, 5 µm to 50 µm. The thicknesses $t_{cast1}$ and $t_{cast2}$ are, for example, 10 µm to 100 µm. The organic insulating films 600 and 700 are formed by the AFCAST method (Align Faces of solvent-CASTing films and harden method).

The sum of the areas of the mounted surfaces 311, 351 and 371 of the lead frames 310, 350, and 370 that are mounted to the first surface 101 of the first metal conductor base 100 is defined as a first area. The area of the mounted surface 324 of the second lead frame 320 that is mounted to the first surface 101 of the first metal conductor base 100 is defined as a second area.

As shown in FIG. 5, the area of the first surface 101 of the first metal conductor base 100 is larger than the sum of the first area and the second area. Further, the first lead frame 310 and the second lead frame 320 are arranged inside an outer edge portion 103 of the first surface 101 of the first metal conductor base 100.

According to this, since each of the lead frames 310, 320, 350 and 370 is surrounded by the first organic insulating film 600 which is an insulator, the insulating property of each of the lead frames 310, 320, 350 and 370 can be ensured. The above relationship is also satisfied between the area of the second surface 201 of the second metal conductor base 200 and the areas of the lead frames 330, 340, 360, and 380. The above is the overall configuration of the semiconductor device 1 according to the present embodiment.

Figure 10:
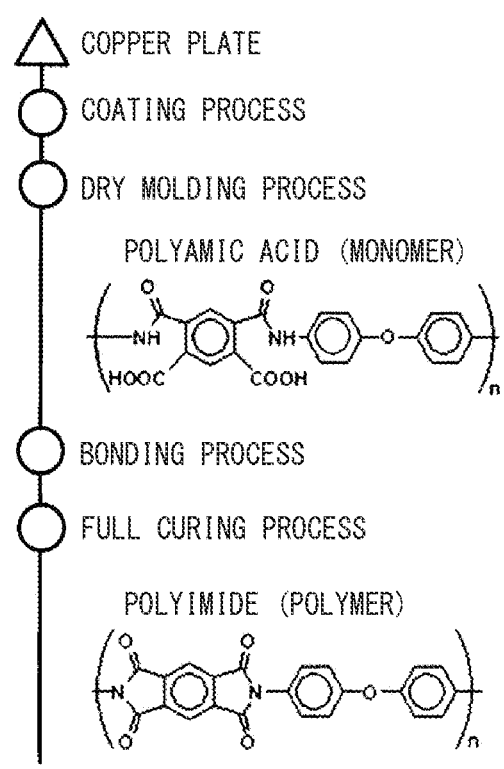
FIG. 10 is a diagram showing a manufacturing process of the semiconductor device.

Next, a manufacturing method of the semiconductor device 1 will be described. In the present embodiment, the metal conductor bases 100 and 200 and the lead frames 310 to 380 are bonded to each other by using the AFCAST method. Specifically, as shown in FIG. 10, a preparation process for preparing a copper plate, a coating process, a dry molding process, a bonding process, and a full curing process are performed in this order.

First, in the preparation process, the metal conductor bases 100 and 200 and the lead frames 310 to 380 are prepared by performing pressing working to the copper plate. For example, the first joint portion 410 is integrally formed with the first lead frame 310 during the press working. The same applies to the second joint portion 420 and the third joint portion 430. Further, each of the first wiring terminals 321 is integrally formed with the second lead frame 320. Each of the second wiring terminals 331 is integrally formed with the third lead frame 330.

Figure 11A:
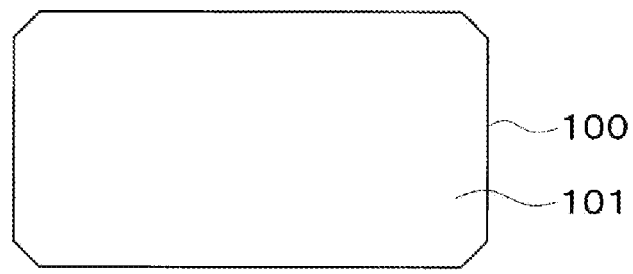
FIG. 11A and FIG. 11B are diagrams for explaining a coating process.
Figure 11B:
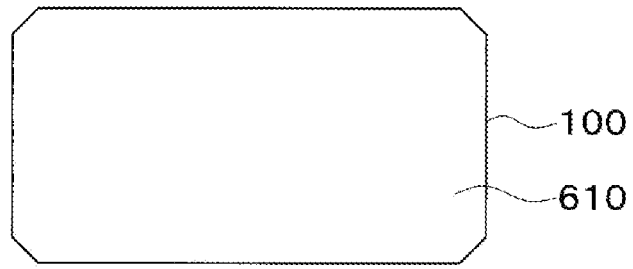
Figure 12A:
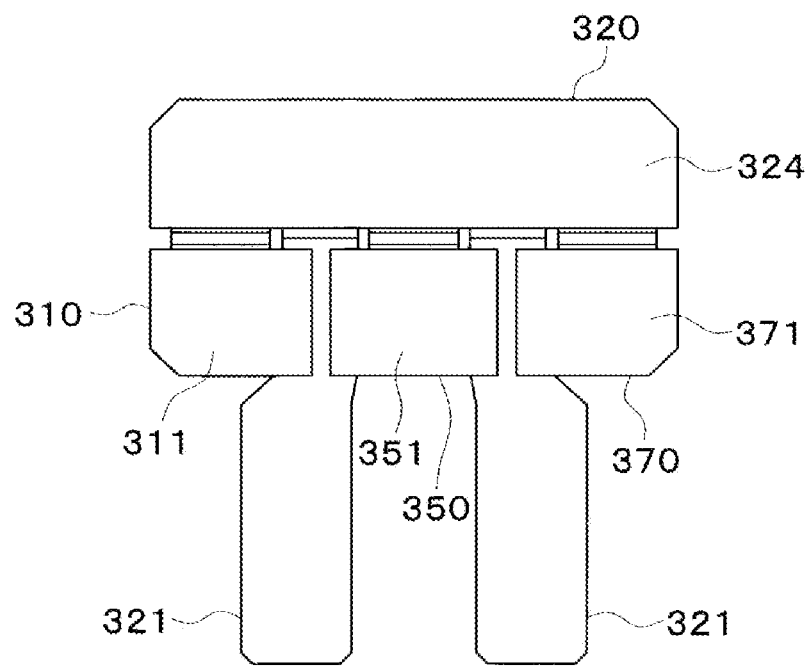
FIG. 12A and FIG. 12B are diagrams for explaining the coating process.
Figure 12B:
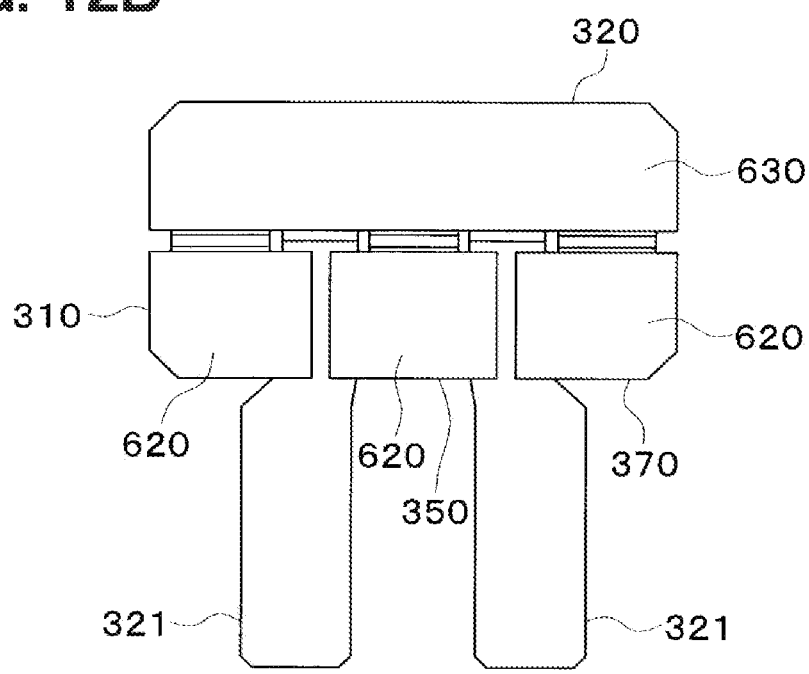

Subsequently, in the coating process, as shown in FIG. 11A and FIG. 11B, the first surface 101 of the first metal conductor base 100 is coated with the first base-side film 610 made of a polyimide-based resin, which is an insulating material. As shown in FIG. 12A and FIG. 12B, the mounted surfaces 311, 351 and 371 of the lead frames 310, 350 and 370 are coated with the first film 620 made of the polyimide-based resin. The mounted surface 324 of the second lead frame 320 is coated with the second film 630 made of the polyimide-based resin.

The polyimide-based resin is obtained by dissolving a polyamic acid, which is obtained by polymerizing an acid anhydride and a diamine at a predetermined molar ratio, in an organic solvent such as N, N-dimethylacetamide or N-methylpyrrolidone (NMP). The acid anhydride includes, for example, pyromellitic dianhydride, biphenyltetracarboxylic dianhydride, benzophenonetetracarboxylic dianhydride, oxydiphthalic acid dianhydride, ethylene glycol bistrimerite dianhydride, or the like. The diamine includes diaminodiphenyl ether, phenylenediamine, polytetramethylene oxide-di-p-aminobenzoate, or the like. As the polyimide-based resin, polyamide-imide having an amide bond introduced into the polyimide chain, polyimidesiloxane having a polysiloxane structure, or the like may be used.

As the coating method, a solution casting method, an extrusion method, a stamp transfer method, a spray method, a cast and spinner method, and the like can be adopted. As described above, in the coating process, a solution containing a solvent is applied as the first base-side film 610, the first film 620, and the second film 630.

The second surface 201 of the second metal conductor base 200 and the lead frames 330, 340, 360, and 380 are also coated with polyimide-based resin films, respectively, in the same manner as described above.

After the coating process, in the dry molding process, the first base-side film 610, the first film 620, and the second film 630 are dried so that the first base-side film 610, the first film 620, and the second film 630 are semi-cured. In the present embodiment, the first base-side film 610, the first film 620, and the second film 630 are semi-cured under the condition that $0.01P_{VP}<P<P_{VP}$ and $T \geq 100°$ C. are satisfied.

Figure 14:
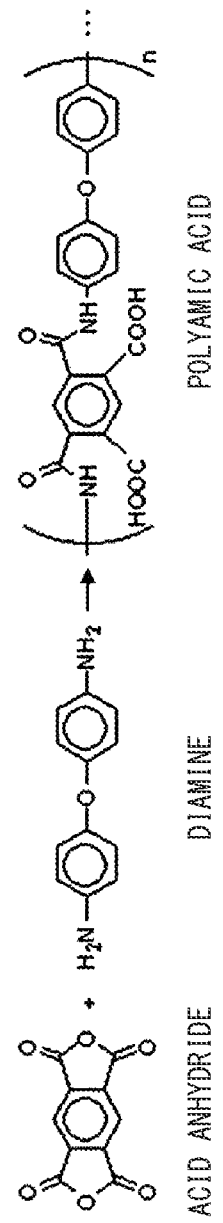
FIG. 14 is a diagram showing the formation of polyamic acid, which is a precursor of polyimide.

Further, $P_{VP}=10^{(9.368-3477/(273.15+T))}$, where T is the temperature of NMP in a case where NMP is adopted as the solvent, and $P_{VP}$ is the vapor pressure of NMP with respect to the temperature T. The vapor pressure is a pressure at which the solvent evaporates. The expression of $P_{VP}$ is an approximate expression calculated experimentally. FIG. 13 shows examples of $P_{VP}$ obtained from the approximate expression. P is a value of a vacuum pressure of a chamber in which the first base-side film 610, the first film 620, and the second film 630 are arranged. When the polyimide-based resin is dried for a certain period of time under the above conditions, NMP, which is the solvent, can be evaporated without fully-curing the polyimide-based resin. As shown in FIG. 14, a polyamic acid, which is a precursor of polyimide, is produced.

The second base-side film 710, the third film 720, and the fourth film 730 are also semi-cured according to the above conditions.

In the bonding process, the first base-side film 610 and the first film 620 are bonded together, and the first base-side film 610 and the second film 630 are bonded together. At the time of bonding, monomer surfaces in a semi-cured state are brought into contact with each other.

Figure 15A:
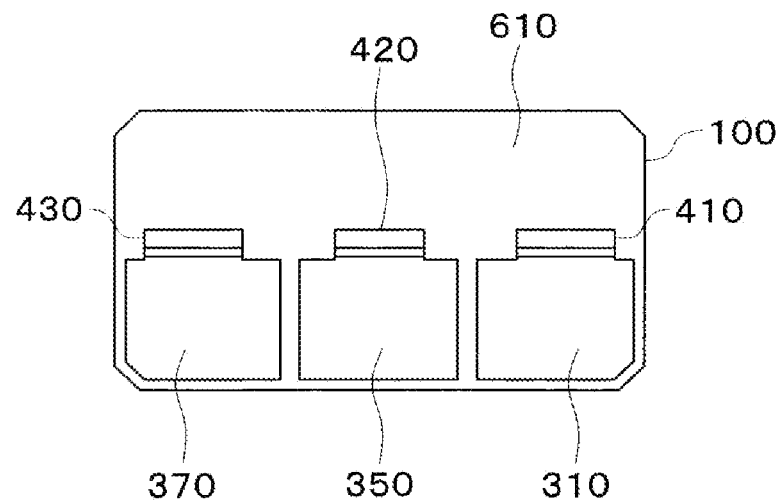
FIG. 15A and FIG. 15B are diagrams for explaining a bonding process.
Figure 15B:
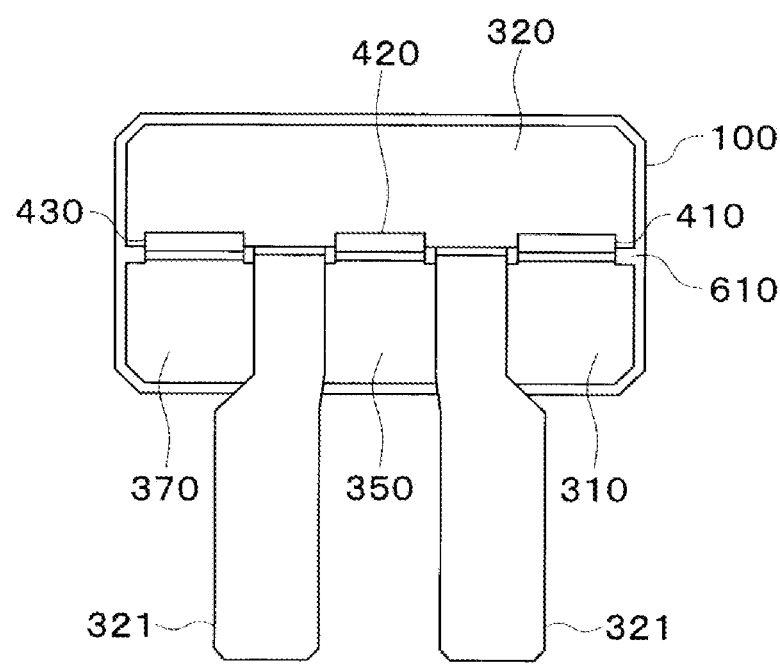

The lead frames 310, 350, 370 are respectively provided with the joint portions 410 to 430. Therefore, as shown in FIG. 15A and FIG. 15B, in order to avoid mechanical interference, the lead frames 310, 350, and 370 are first mounted to the first metal conductor base 100, and then the second lead frame 320 is mounted to the first metal conductor base 100.

The second metal conductor base 200 and the lead frames 330, 340, 360, and 380 are also bonded in the same manner as described above.

Figure 16:
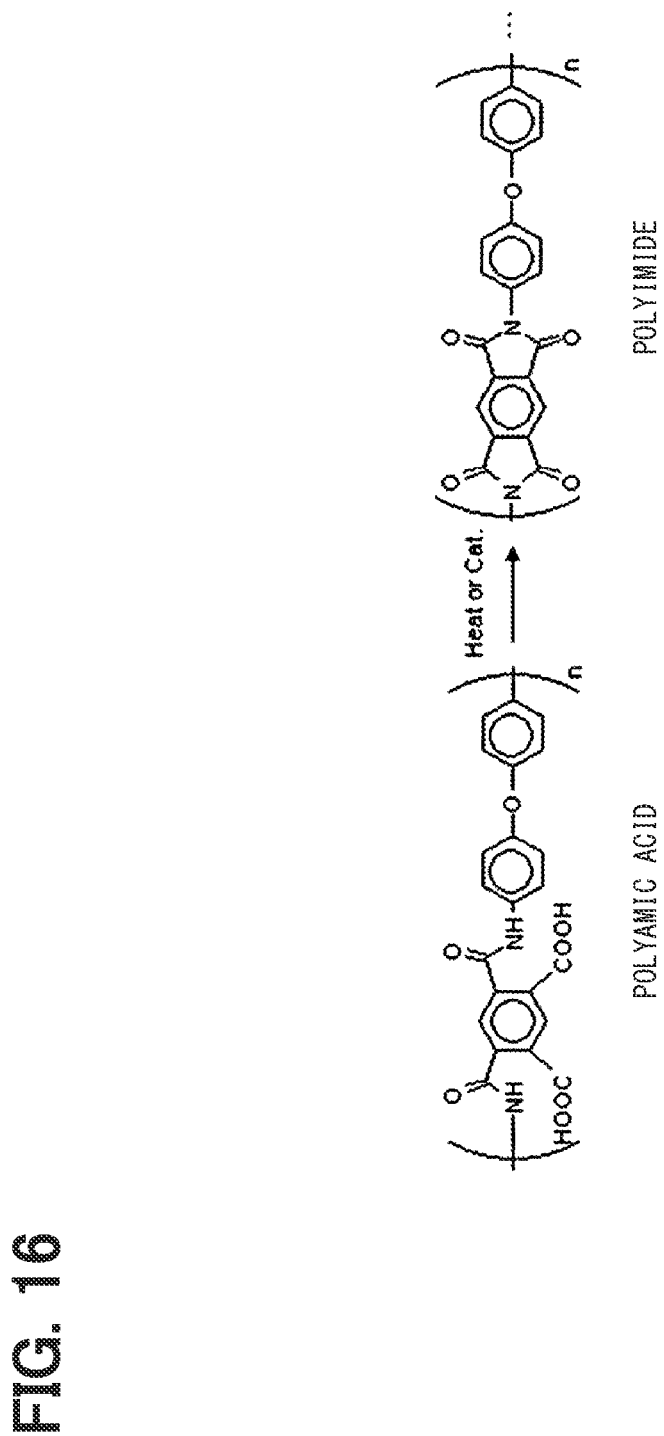
FIG. 16 is a diagram for explaining the formation of a polyimide film.

After that, in the full curing process, the first organic insulating film 600 is formed by curing the first base-side film 610, the first film 620, and the second film 630. As shown in FIG. 16, a polyimide film is formed by heating a polyamic acid at, for example, 200° C. or higher, or dehydrating and cyclizing a polyamic acid with a catalyst. The polyimide film becomes the organic insulating film 600, 700.

Figure 17:
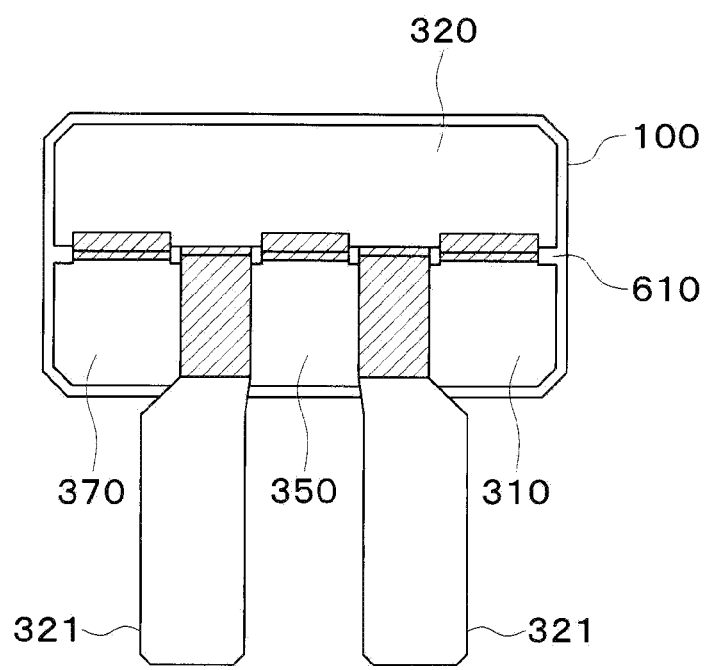
FIG. 17 is a diagram showing a portion where no press pressure is applied in a full curing process.

In the present embodiment, the first base-side film 610, the first film 620, and the second film 630 are cured in a state where press pressure is applied to the first metal conductor base 100 and the lead frames 310, 320, 350, and 370. As shown in FIG. 17, the press pressure is applied to portions excluding shaded portions in consideration of the joint portions 410 to 430 and the first wiring terminal 321.

Here, the first base-side film 610, the first film 620, and the second film 630 are cured in a state where the press pressure between the first metal conductor base 100 and each of the lead frames 310, 320, 350, and 370 exceeds 5 Mpa. The surfaces of the first base side film 610, the first film 620, and the second film 630 are not a little uneven. However, the influence of surface roughness can be reduced by curing the first base-side film 610, the first film 620, and the second film 630 while applying the press pressure.

Figure 18:
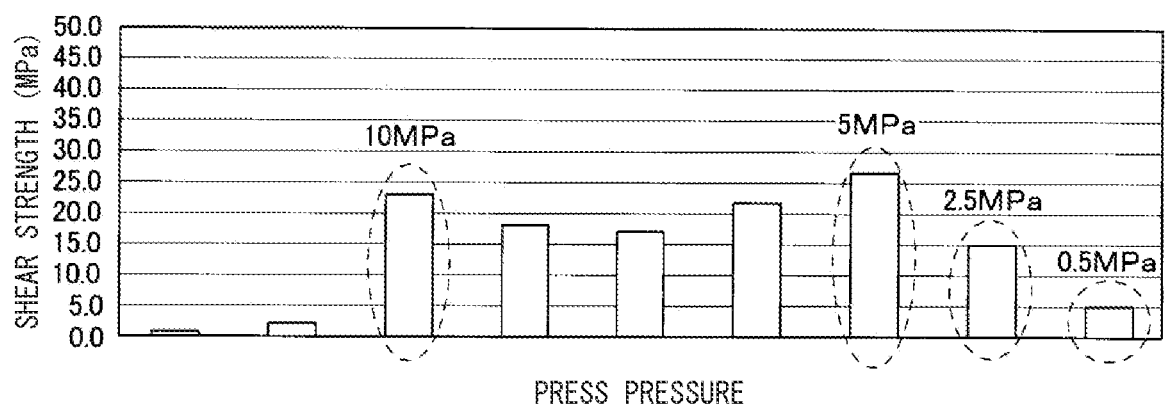
FIG. 18 is a diagram showing a relationship between a press pressure and a shear strength.

The present inventors investigated the shear strength when the press pressure was changed. The shear strength is the strength of the force with which the lead frames 310, 320, 350 and 370 slide on the first metal conductor base 100 when a force is applied to the lead frames 310, 320, 350 and 370. The results are shown in FIG. 16. As shown in FIG. 18, sufficient shear strength was obtained when the press pressure was in the range of 5 MPa to 10 MPa. Therefore, it is desirable to apply a press pressure exceeding 5 Mpa.

Figure 19:
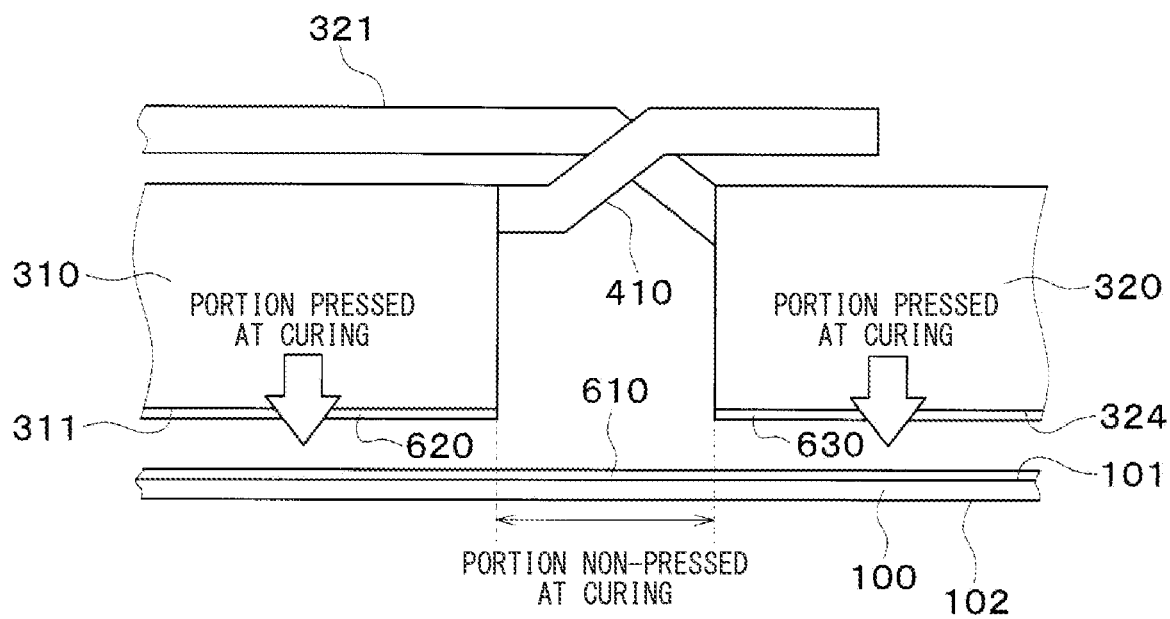
FIG. 19 is a diagram showing a pressurized portion and a non-pressurized portion with the press pressure in the full curing process.

As shown in FIG. 19, in the full curing process, the press pressure is applied to the portions of the first base-side film 610 that are sandwiched between the first metal conductor base 100 and the lead frames 310, 320, 350, and 370. On the other hand, no press pressure is applied to the portion of the first base-side film 610 that is not sandwiched between the first metal conductor base 100 and the lead frames 310, 320, 350, and 370. Therefore, a jig is used for applying uniform pressure to the portion that is not sandwiched. That is, a load is applied to the center of gravity of the jig.

Then, in the full curing process, the first organic insulating film 600 is formed so that the thickness of the first organic insulating film 600 satisfies relationships of $t_{press1} > t_{cast1}$ and $t_{press2} > t_{cast1}$.

The films between the second metal conductor base 200 and the lead frame 330, 340, 360, and 380 are also subjected to the full curing process in the same manner as described above to form the second organic insulating film 700 that satisfies the thickness condition. As a method of lowering the press pressure, thermoplastic resins may be adopted as the organic insulating films 600 and 700.

After the full curing process, a mounting process of mounting the power elements 510 to 560 is performed. The power elements 510, 530, and 550 are respectively mounted to the lead frames 310, 350, and 370, and the power elements 520, 540, and 560 are mounted to the second lead frame 320. Further, the signal terminals 511, 521, 532, 542, 552, 562 are respectively mounted to the power element 510 to 560, and the heat sinks 514, 524, 531, 541, 551, 561 are respectively mounted above the power elements 510 to 560. Further, the output terminal 570 to 572 are prepared, and the output terminals 570 to 572 and the power element 510 to 560 are connected.

After that, the connection process is performed. In the thickness direction, the lead frames 330, 340, 360, and 380 are arranged above the lead frames 310, 320, 350, and 370. Then, the lead frames 330, 340, 360, and 380 are joined to the heat sink 514, 524, 513, 541, 551, 561. Further, the joint portions 410 to 430 of the lead frames 310, 350 and 370 are electrically connected to the lead frames 340, 360 and 380.

Subsequently, a molding process of forming the molding resin portion 800 is performed. First, the above-described joined body is fixed to a mold. A molten resin material is poured through a gate of the mold, and the resin material is cured to form the mold resin portion 800. In this way, the semiconductor device 1 is manufactured.

Figure 20:
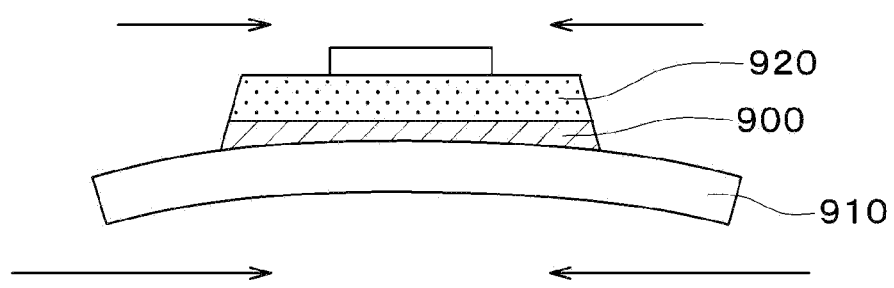
FIG. 20 is a diagram for explaining a warpage of a substrate when a temperature stress is generated.

The present inventors investigated a warpage of the first metal conductor base 100 in the semiconductor device 1 manufactured by the above method. As shown in FIG. 20, when temperature stress is generated, in a case where an insulation portion 900 has high rigidity, a warpage occurs due to the stress difference between a front conductor 910 and a rear conductor 920. The insulating portion 900 corresponds to each of the organic insulating films 600, 700, the front conductor 910 corresponds to each of the metal conductor bases 100, 200, and the rear conductor 920 corresponds to each of the lead frames 310 to 380.

Therefore, the hardness of the first organic insulating film 600, that is, the warpage of the first metal conductor base 100 when the Young's modulus was changed was investigated by simulation. As shown in FIG. 21, three types of Cu, PI, and SiN were used as the materials of the first metal conductor base 100.

For Cu, the base plate thickness of the first metal conductor base 100 was changed. That is, a front-rear volume ratio was changed. When the volume of the first metal conductor base 100 is defined as a base conductor volume and the sum of the volumes of the lead frames 310, 320, 350, 370 is defined as a mounted-side volume, the front-rear volume ratio is obtained by dividing the mounted-side volume by the base conductor volume. The Young's modulus of the first organic insulating film 600 was changed to 4 GPa, 8 GPa, and 20 GPa. For PI and SiN, values of the base plate thickness were fixed. In addition, a warpage analysis was performed under the condition of no temperature characteristics. The results are shown in FIG. 22.

Figure 22:
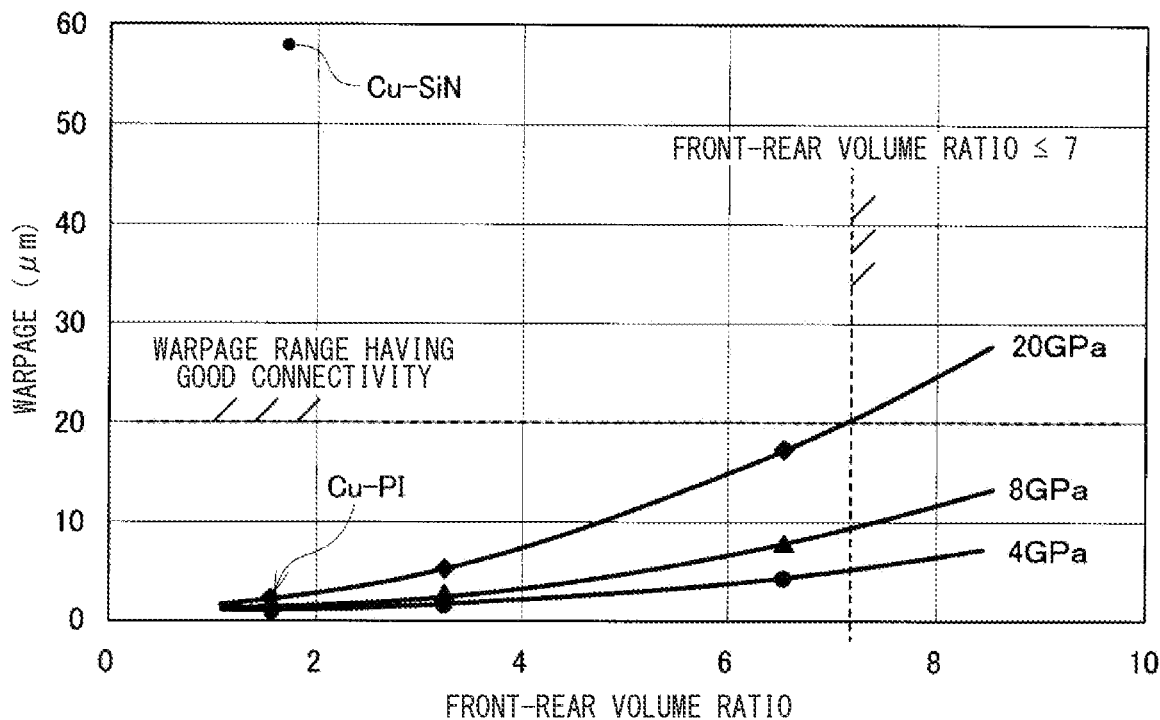
FIG. 22 is a diagram showing a relationship between a front-rear volume ratio and a warpage of the substrate.

As shown in FIG. 22, in a Cu—Si set, a large warpage occurred in the SiN substrate. On the other hand, in a Cu—PI set, a warpage of the PI substrate was small. On the other hand, it was found that in a Cu—Cu set, good connectivity can be obtained when the Young's modulus of the first organic insulating film 600 is less than 20 GPa and the volume ratio of the front-rear volume ratio is 7.0 or less. This follows the change of the first metal conductor base 100 having high rigidity because the first organic insulating film 600 has low elasticity of 10 GPa or less. Therefore, the first metal conductor base 100 does not warp even with a complicated metal pattern. Therefore, by satisfying the above conditions, good connectivity of each power element 510 to 560 by solder can be ensured.

The above relationship is the same for the second metal conductor base 200, each lead frame 330, 340, 360, 380, and the second organic insulating film 700.

As described above, the lead frames 310, 350, 370 and the lead frames 340, 360, 380 disposed at different positions in the arrangement direction and the thickness direction are connected by the joint portions 410 to 430. As a result, the lead frames 310, 350, 370 and the lead frames 340, 360, 380 can be electrically connected at the shortest distance. Therefore, it is possible to reduce the size of the semiconductor device 1 in which the power elements 510 to 560 are integrated in the arrangement direction.

Further, the metal conductor bases 100 and 200 and the lead frames 310 to 380 are fixed by the organic insulating films 600 and 700 of the polyimide-based material. Therefore, processing such as machining and etching of a metal plate as the source of the lead frames 310 to 380 is unnecessary. In addition, each component can be fixed with the polyimide-based material which is inexpensive. Therefore, the cost of the semiconductor device 1 can be reduced.

Further, the thicknesses of the portions of the organic insulating films 600 and 700 that are not sandwiched between the metal conductor bases 100 and 200 and the lead frames 310 to 380 are thinner than the portions of the organic insulating films 600 and 700 that are sandwiched between the metal conductor bases 100 and 200 and the lead frames 310 to 380. Therefore, the binding force of the mold resin portion 800 is more likely to act on the portions of the organic insulating coatings 600 and 700 that are not sandwiched between the metal conductor bases 100 and 200 and the lead frames 310 to 380, peeling of the portions can be suppressed. Therefore, the reliability of the semiconductor device 1 can be ensured.

As a modification, the joint portions 410 to 430 may not be integrated with the lead frames 310, 350, and 370 in advance. That is, the joint portions 410 to 430 may be configured as components separated from the lead frames 310, 350, and 370. Alternatively, each the joint portions 410 to 430 may be integrated with the lead frames 340, 360, and 380 in advance. In this case, the joint portions 410 to 430 are connected to the lead frames 310, 350 and 370 in the connecting process.

As a modification, each of the base-side films 610, 710 and each of the films 620, 630, 720, 730 may be composed of multiple layers instead of one layer.

The first metal conductor base 100, the first surface 101, and the second surface 102 respectively correspond to a metal conductor base, a first surface, and a second surface. The first joint portion 410, the first end portion 411, and the second end portion 412 respectively correspond to a joint portion, a first end portion, and a second end portion. Further, the first organic insulating film 600 corresponds to an organic insulating film, and the first base side film 610 corresponds to a base-side film.

Second Embodiment

In the present embodiment, portions different from those of the first embodiment will be mainly described. When the present inventors investigated the relationship between the drying temperature and the shear strength, it was found that the shear strength changes depending on the drying temperature. The drying time was, for example, 60 minutes. The results are shown in FIG. 23.

Figure 23:
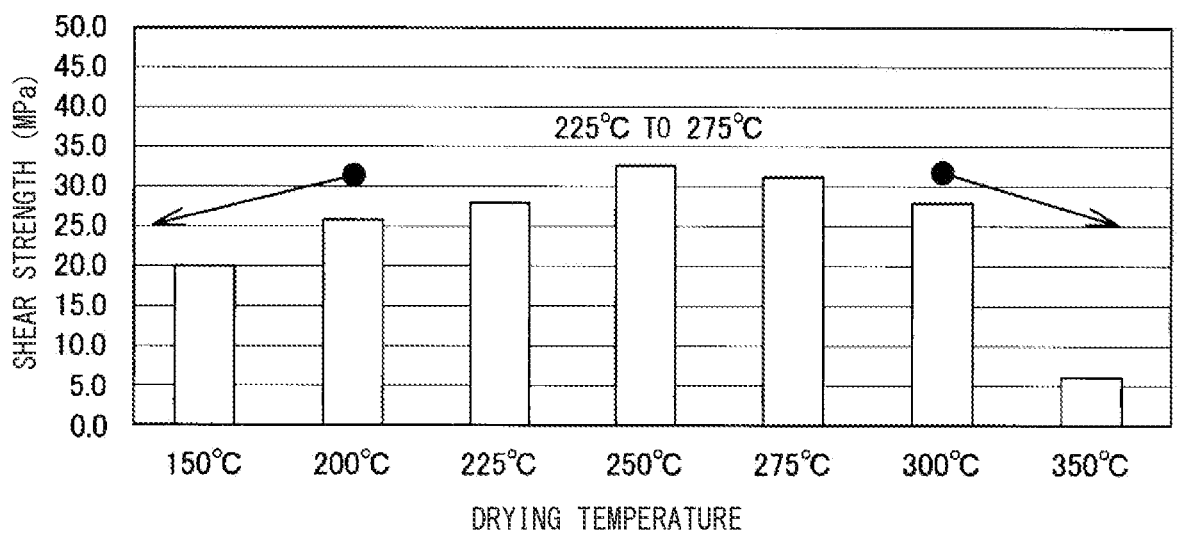
FIG. 23 is a diagram showing a relationship between a drying temperature of each film and a shear strength in a dry molding process according to a second embodiment.

As shown in FIG. 23, it was found that high shear strength can be obtained by heating the first base-side film 610, the first film 620, and the second film 630 in the temperature range from 225° C. to 275° C. It is presumed that this is because the adhesion was inhibited by the residual NMP at a drying temperature of less than 225° C. Further, it is presumed that the adhesion was inhibited by the completion of the curing reaction at a drying temperature exceeding 275° C.

Therefore, in the dry molding process, the first base-side film 610, the first film 620, and the second film 630 are heated at a temperature in a range from 225° C. to 275° C. Under the temperature condition, a high shear strength can be obtained by semi-curing the first base-side film 610, the first film 620, and the second film 630.

The second base-side film 710, the third film 720, and the fourth film 730 are also semi-cured according to the above condition.

Other Embodiments

The configurations of the semiconductor device 1 according to the above embodiments are examples of the present disclosure, and the configuration is not limited and can be achieved by other configurations within the present disclosure. For example, in each of the above embodiments, a double-sided heat dissipation structure that dissipates heat from both the metal conductor bases 100 and 200 is shown, but for example, a single-sided heat dissipation structure that dissipates heat from the first metal conductor base 100 may be adopted. Further, the number of the first wiring terminals 321 may be one. Similarly, the number of the second wiring terminals 331 may be one.

In each of the above embodiments, a structure in which six power elements 510 to 560 are integrated into one is employed, but for example, a structure in which two power elements 510 and 520 are integrated may also be employed. Alternatively, a structure in which four power elements 510 to 540 are integrated may be also employed.

In each of the above embodiments, the press pressure is applied in the full curing process, but the press pressure may not be applied.

What is claimed is:

1. A semiconductor device comprising:
a metal conductor base having a first surface and a second surface located on an opposite side from the first surface;
a first lead frame fixed to the first surface of the metal conductor base;
a second lead frame fixed to the first surface of the metal conductor base and arranged away from the first lead frame;
a third lead frame arranged above the first lead frame in a thickness direction that is perpendicular to the first surface of the metal conductor base;
a fourth lead frame arranged above the second lead frame in the thickness direction;
a joint portion having a first end portion and a second end portion located on an opposite side from the first end portion, the first end portion being integrated with the first lead frame, the second end portion being integrated with the fourth lead frame, the joint portion electrically connecting the first lead frame and the fourth lead frame;
a first power element arranged between the first lead frame and the third lead frame and electrically connected to the first lead frame and the third lead frame;
a second power element arranged between the second lead frame and the fourth lead fame and electrically connected to the second lead frame and the fourth lead frame; and
a mold resin portion integrally sealing a part of the metal conductor base, the first lead frame, the second lead frame, the first power element, the second power element, the joint portion, the third lead frame, and the fourth lead frame in a state where the second surface of the metal conductor base is exposed from the mold resin portion, wherein
fixing of the first lead frame to the first surface of the metal conductor base and fixing of the second lead frame to the first surface of the metal conductor base are ensured by an organic insulating film made of a polyimide-based material,
the organic insulating film satisfies relationships of $t_{press1} > t_{cast1}$ and $t_{press2} > t_{cast1}$, where $t_{press1}$ is a thickness of a portion of the organic insulating film that is sandwiched between the metal conductor base and the first lead frame, $t_{press2}$ is a thickness of a portion of the organic insulating film that is sandwiched between the metal conductor base and the second lead frame, and $t_{cast1}$ is a thickness of a portion of the organic insulating film that is not sandwiched between the metal conductor base and the first lead frame and is not sandwiched between the metal conductor base and the second lead frame.

2. The semiconductor device according to claim 1, wherein
the first surface of the metal conductor base has an area larger than a sum of an area of a mounted surface of the first lead frame that is mounted to the first surface of the metal conductor base and an area of a mounted surface of the second lead frame that is mounted to the first surface of the metal conductor base, and
the first lead frame and the second lead frame are arranged inside an outer edge portion of the first surface of the metal conductor base.

3. The semiconductor device according to claim 1, wherein
the organic insulating film includes a base-side film, a first film, and a second film,
the base-side film is disposed on the first surface of the metal conductor base,
the first film is disposed on a mounted surface of the first lead frame that is mounted to the first surface of the metal conductor base,
the second film is disposed on a mounted surface of the second lead frame that is mounted to the first surface of the metal conductor base, and
a surface layer portion of the first film and a surface layer portion of the second film are chemically bonded with a surface layer portion of the base-side film by forming a polymer.

4. The semiconductor device according to claim 1, wherein
the organic insulating film has a Young's modulus of less than 20 GPa, and
a front-rear volume ratio obtained by dividing a mounted-side volume by a base conductor volume is 7.0 or less, where the mounted-side volume is a sum of a volume of the first lead frame and a volume of the second lead frame, and the base conductor volume is a volume of the metal conductor base.

5. The semiconductor device according to claim 1, further comprising:
a first wiring terminal having a first connection portion and a first tip portion located on an opposite side from the first connection portion; and
a second wiring terminal having a second connection portion and a second tip portion located on an opposite side from the second connection portion, wherein
the first connection portion of the first wiring terminal is integrated with the second lead frame,
the first tip portion of the first wiring terminal is arranged opposite from the second lead frame with reference to the first lead frame in an arrangement direction in which the first lead frame and the second lead frame are arranged,
a part of an intermediate portion between the first connection portion and the first tip portion of the first wiring terminal is arranged between the first lead frame and the third lead frame without coming into contact with the first lead frame, the third lead frame, and the first power element,
the second connection portion of the second wiring terminal is integrated with the third lead frame,
the second tip portion of the second wiring terminal is arranged opposite from the fourth lead frame with reference to the third lead frame in the arrangement direction, and
the mold resin portion seals the first wiring terminal and the second wiring terminal in a state where the first tip portion of the first wiring terminal and the second tip portion of the second wiring terminal are exposed from the mold resin portion.

6. The semiconductor device according to claim 1, wherein
the first lead frame, the second lead frame, the third lead frame, the fourth lead frame, the joint portion, the first power element, and the second power element are included in each of three sets,
the three sets are arranged on the first surface of the metal conductor base in a direction that is perpendicular to an arrangement direction in which the first lead frame and the second lead frame are arranged on the first surface of the metal conductor base,
the second lead frames in the three sets are integrally configured as one lead frame, and
the third lead frames in the three sets are integrally configured as one lead frame.

7. The semiconductor device according to claim 1, wherein the metal conductor base is defined as a first metal conductor base and the organic insulating film is defined as a first organic insulating film, the semiconductor device further comprising:
a second metal conductor base having a first surface and a second surface located on an opposite from the first surface, wherein
the third lead frame and the fourth lead frame are fixed to the first surface of the second metal conductor base so as to be away from each other,
the mold resin portion seals the part of the first metal conductor base, the first lead frame, the second lead frame, the first power element, the second power element, the joint portion, the third lead frame, the fourth lead frame, and a part of the second metal conductor base in a state where the second surface of the first metal conductor base and the second surface of the second metal conductor base are exposed from the mold resin portion,
fixing of the third lead frame to the first surface of the second metal conductor base and fixing of the fourth lead frame to the first surface of the second metal conductor base are ensured by a second organic insulating film made of a polyimide-based material, and
the second organic insulating film satisfies relationships of $t_{press3} > t_{cast2}$ and $t_{press4} > t_{cast2}$, where $t_{press3}$ is a thickness of a portion of the second organic insulating film that is sandwiched between the second metal conductor base and the third lead frame, $t_{press4}$ is a thickness of a portion of the second organic insulating film that is sandwiched between the second metal conductor base and the fourth lead frame, and $t_{cast2}$ is a thickness of a portion of the second organic insulating film that is not sandwiched between the second metal conductor base and the third lead frame and is not sandwiched between the second metal conductor base and the fourth lead frame.

8. A manufacturing method of a semiconductor device that includes:
a metal conductor base having a first surface and a second surface located on an opposite side from the first surface;
a first lead frame fixed to the first surface of the metal conductor base by an organic insulating film made of a polyimide-based material;

a second lead frame fixed to the first surface of the metal conductor base by the organic insulating film and arranged away from the first lead frame;

a third lead frame arranged above the first lead frame in a thickness direction that is perpendicular to the first surface of the metal conductor base;

a fourth lead frame arranged above the second lead frame in the thickness direction;

a joint portion having a first end portion and a second end portion located on an opposite side from the first end portion, the first end portion being integrated with the first lead frame, the second end portion being integrated with the fourth lead frame, the joint portion electrically connecting the first lead frame and the fourth lead frame;

a first power element arranged between the first lead frame and the third lead frame and electrically connected to the first lead frame and the third lead frame;

a second power element arranged between the second lead frame and the fourth lead fame and electrically connected to the second lead frame and the fourth lead frame; and a mold resin portion integrally sealing a part of the metal conductor base, the first lead frame, the second lead frame, the first power element, the second power element, the joint portion, the third lead frame, and the fourth lead frame in a state where the second surface of the metal conductor base is exposed from the mold resin portion, the manufacturing method comprising:

preparing the metal conductor base, the first lead frame, and the second lead frame;

coating the first surface of the metal conductor base with a base-side film made of a polyimide-based resin, coating a mounted surface of the first lead frame that is mounted to the first surface of the metal conductor base with a first film made of the polyimide-based resin, and coating a mounted surface of the second lead frame that is mounted to the first surface of the metal conductor base with a second film made of the polyimide-based resin;

drying the base-side film, the first film, and the second film to semi-cure the base-side film, the first film, and the second film;

bonding the base-side film with the first film, and bonding the base-side film with the second film;

curing the base-side film, the first film, and the second film to form the organic insulating film; and arranging the third lead frame above the first lead frame in the thickness direction, arranging the fourth lead frame above the second lead frame in the thickness direction, and electrically connecting the first lead frame and the fourth lead frame by the joint portion, wherein the curing of the base-side film, the first film, and the second film includes forming the organic insulating film so as to satisfy relationships of $t_{press1} > t_{cast1}$ and $t_{press2} > t_{cast1}$, where $t_{press1}$ is a thickness of a portion of the organic insulating film that is sandwiched between the metal conductor base and the first lead frame, $t_{press2}$ is a thickness of a portion of the organic insulating film that is sandwiched between the metal conductor base and the second lead frame, and $t_{cast1}$ is a thickness of a portion of the organic insulating film that is not sandwiched between the metal conductor base and the first lead frame and is not sandwiched between the metal conductor base and the second lead frame.

9. The manufacturing method according to claim 8, wherein the coating with the base-side film, the first film, and the second film includes applying a solution containing a solvent, the drying of the base-side film, the first film, and the second film includes semi-curing the base-side film, the first film, and the second film in a state that satisfies relationships of $0.01 P_{VP} < P < P_{VP}$, $P_{VP} = 10^{(9.368 - 3477/(273.15 + T))}$, and $T \geq 100°$ C., where T is a temperature of the solvent, $P_{VP}$ is a vapor pressure of the solvent with respect to the temperature T, and P is a vacuum pressure in which the base-side film, the first film, and the second film are arranged.

10. The manufacturing method according to claim 8, wherein the drying of the base-side film, the first film, and the second film includes semi-curing the base-side film, the first film, and the second film by heating at a temperature in a range from 225° C. to 275° C.

11. The manufacturing method according to claim 8, wherein the curing of the base-side film, the first film, and the second film is performed in a state where a press pressure between the metal conductor base and the first lead frame exceeds 5 MPa and a press pressure between the metal conductor base and the second lead frame exceeds 5 MPa, to form the organic insulating film.

* * * * *